(12) United States Patent
Cao et al.

(10) Patent No.: US 9,632,937 B2
(45) Date of Patent: Apr. 25, 2017

(54) PRE-DECODING ANALYSIS BASED CONFIGURATION INFORMATION CACHE MANAGEMENT METHOD AND SYSTEM

(71) Applicant: Southeast University, Jiangsu (CN)

(72) Inventors: Peng Cao, Jiangsu (CN); Jun Yang, Jiangsu (CN); Longxing Shi, Jiangsu (CN); Bo Liu, Jiangsu (CN); Jinjiang Yang, Jiangsu (CN); Leibo Liu, Jiangsu (CN); Shouyi Yin, Jiangsu (CN); Shaojun Wei, Jiangsu (CN)

(73) Assignee: Southeast University, Jiangsu (CN)

( * ) Notice: Subject to any disclaimer, the term of this patent is extended or adjusted under 35 U.S.C. 154(b) by 123 days.

(21) Appl. No.: 14/430,411

(22) PCT Filed: Nov. 13, 2013

(86) PCT No.: PCT/CN2013/087014
§ 371 (c)(1),
(2) Date: Aug. 7, 2015

(87) PCT Pub. No.: WO2014/090067
PCT Pub. Date: Jun. 19, 2014

(65) Prior Publication Data
US 2015/0331799 A1    Nov. 19, 2015

(30) Foreign Application Priority Data
Dec. 13, 2012    (CN) .......................... 2012 1 0536421

(51) Int. Cl.
*G06F 12/08* (2016.01)
*G06F 12/0862* (2016.01)
*G06F 3/06* (2006.01)
*G06F 17/50* (2006.01)
*H04L 29/08* (2006.01)

(52) U.S. Cl.
CPC ........ *G06F 12/0862* (2013.01); *G06F 3/0604* (2013.01); *G06F 3/0631* (2013.01); *G06F 3/0673* (2013.01); *G06F 17/5054* (2013.01); *G06F 2212/1041* (2013.01);
(Continued)

(58) Field of Classification Search
None
See application file for complete search history.

(56) References Cited

U.S. PATENT DOCUMENTS

2010/0070867 A1    3/2010   Lemmers

FOREIGN PATENT DOCUMENTS

| CN | 101584211 A | 11/2009 |
|---|---|---|
| CN | 102279753 A | 12/2011 |

(Continued)

OTHER PUBLICATIONS

International Search Report, International Application No. PCT/CN2013/087014, filed Nov. 13, 2013.

*Primary Examiner* — Kevin Verbrugge
(74) *Attorney, Agent, or Firm* — Dinsmore & Shohl LLP

(57) ABSTRACT

Disclosed are a pre-decoding analysis-based configuration information cache management system, comprising a streaming media processing module, a configuration information prefetch FIFO module, a configuration information storage unit, and a cache controller module. Also disclosed is a management method for the pre-decoding analysis-based configuration information cache management system. The present invention allows for increased dynamic reconfiguration efficiency of a large-scale coarse-grained reconfigurable system.

10 Claims, 3 Drawing Sheets

(52) U.S. Cl.
CPC .. *G06F 2212/601* (2013.01); *G06F 2212/602* (2013.01); *G06F 2212/6028* (2013.01); *H04L 67/2842* (2013.01)

(56) References Cited

FOREIGN PATENT DOCUMENTS

| CN | 202183093 U | 4/2012 |
| --- | --- | --- |
| CN | 102968390 A | 3/2013 |
| CN | 202995712 U | 6/2013 |

| Address N | 7 |
|---|---|
| ...... | |
| Address 2 | 2 |
| Address 1 | 1 |
| Address 0 | 0 |
| Configuration Information Address | Target Reconfigurable Array ID |

PRE-DECODING ANALYSIS BASED CONFIGURATION INFORMATION CACHE MANAGEMENT METHOD AND SYSTEM

CROSS-REFERENCE TO RELATED APPLICATIONS

This application is the U.S. national stage of PCT/CN2013/087014 filed Nov. 13, 2013, which claims priority of Chinese Patent Application 201210536421.7 filed Dec. 13, 2012, the entirety of which is incorporated herein by reference.

FIELD OF THE INVENTION

The present invention belongs to the embedded reconfigurable design field, and relates to configuration information cache management method and system based pre-decoding analysis, in particular to a method and a system for managing configuration information caches on the basis of pre-decoding analysis applicable to a reconfigurable system that is oriented to media processing.

BACKGROUND OF THE INVENTION

As a sort of computing architecture that incorporates the high flexibility of General Purpose Processors (GPPs) and the high efficiency of Application Specific Integrated Circuits (ASICs), reconfigurable computing architecture receives more and more attention in embedded system design in recent years, and the application fields of reconfigurable computing architecture mainly include multimedia processing, mobile communication, digital signal processing, and data encryption/decryption, etc. Granularity refers to the data bit width of the processing elements included in a reconfigurable system, and it determines the data processing capability of the reconfigurable system. Usually, granularities not exceeding 4 bits are referred to as fine granularities, while granularities exceeding 4 bits are referred to as coarse granularities. Reconfigurable systems can be classified into fine-grained reconfigurable systems and coarse-grained reconfigurable system according to the computed granularity. Since the computing units are configured at the operation level, coarse-grained reconfigurable systems can significantly reduce the overhead of system reconfiguration when compared with fine-grained reconfigurable systems.

As performance requirement and complexity of computation in media applications become increasingly higher, the computing resources required in coarse-grained reconfigurable architecture are increased in multiples. In some types of architecture, multiple reconfigurable arrays are employed to accomplish these applications. However, as the computing resources are increased, the volume of configuration information required in the reconfiguration process is further increased, resulting in further increased reconfiguration overhead of the system and severely degraded overall system performance. In the design of a coarse-grained reconfigurable system, the structure and management method for configuration information cache are key techniques, and determine the reconfiguration efficiency of dynamic system. Most configuration information cache management methods in conventional coarse-grained reconfigurable systems are designed with reference to the instructions cache management method of general purpose processor systems, without consideration of the characteristics of the hardware structure and specific application algorithm of the reconfigurable system. Consequently, the limited configuration information transmission capacity of the system does not match the powerful operating capacity, and can not meet the demanding requirement of the application algorithm for high performance.

SUMMARY OF THE INVENTION

Object of the Invention

In view of the problems and drawbacks in the prior art, the object of the present invention is to provide configuration information cache management method and system based on pre-decoding analysis, which can improve the efficiency of dynamic reconfiguration in large-size coarse-grained reconfigurable systems.

Technical Solution

To attain the above-mentioned object of the present invention, a first technical solution employed in the present invention is a configuration information cache management system based on pre-decoding analysis, comprising a stream media processor module, a configuration information prefetching FIFO (First Input First Output) module, a configuration information memory unit, and a cache controller module;

the stream media processor module is configured to parse the macro blocks in the code stream obtained from the external memory, generate a configuration information index corresponding to the subtask required for processing the macro blocks, and output the configuration information index to the configuration information prefetching FIFO module; the configuration information index comprises the address of configuration information in the external memory (abbreviated as "configuration information address") and the ID of the reconfigurable array that uses the configuration information (abbreviated as "target reconfigurable array ID");

the configuration information prefetching FIFO module is configured to sequentially store the configuration information indexes generated by the stream media processor module, and provide a basis for replacement of the configuration information in the configuration information memory unit;

the configuration information memory unit is configured to cache the configuration information fetched from the external memory;

the cache controller module is configured to fetch a configuration information index from the configuration information prefetching FIFO module, and judge whether the required configuration information exists in the configuration information memory unit according to the address of the configuration information in the external memory; if the required configuration information exists in the configuration information memory unit, the cache controller module will directly read the configuration information; if the required configuration information does not exist in the configuration information memory unit, the cache controller module will fetch the required configuration information from the external memory, and then cache the required configuration information in the configuration information memory unit, and finally send the required configuration information to the corresponding reconfigurable array.

Preferably, the configuration information prefetching FIFO module comprises N FIFO units, each of which stores the address of configuration information in the external memory and the ID of the reconfigurable array that uses the configuration information.

Preferably, the configuration information memory unit comprises M memory blocks, each of which stores the address of configuration information in the external memory, content of configuration information, and priority of configuration information (abbreviated as "priority").

A second technical solution employed in the present invention is a management method that utilizes the above-mentioned configuration information cache management system based on pre-decoding analysis, comprising the following steps:

(1) (1) generating a configuration information index: by parsing the macro blocks in a code stream obtained from the external memory in advance, the stream media processor generates a configuration information index corresponding to the subtask required for processing the macro blocks, and outputs the configuration information index to the configuration information prefetching FIFO module; the configuration information index comprises the address of configuration information in the external memory and the ID of the reconfigurable array that uses the configuration information;

(2) (2) searching for, reading, and replacing configuration information: the cache controller module fetches a configuration information index from the configuration information prefetching FIFO module, and searches for the required configuration information in the configuration information memory unit according to the address of the configuration information in the external memory; if the required configuration information exists in the configuration information memory unit, the cache controller module will directly read the required configuration information; if the required configuration information does not exist in the configuration information memory unit, the cache controller module will fetch the required configuration information from the external memory, and then cache the required configuration information in the configuration information memory unit, and replace the configuration information in the configuration information memory unit;

(3) (3) sending configuration information: the cache controller module sequentially sends the configuration information read by it to the corresponding reconfigurable arrays.

Preferably, the procedure of replacing the configuration information in the configuration information memory unit comprises: replacing a set of configuration information with the lowest priority in the configuration information memory unit with the required configuration information. More preferably, the priority of configuration information is the number of occurrence times of the address of configuration information in the external memory in the configuration information prefetching FIFO module at the current moment. Even more preferably, the priority is updated before the configuration information is replaced.

Preferably, the configuration information prefetching FIFO module comprises N FIFO units, each of which stores the address of configuration information in the external memory and the ID of the reconfigurable array that uses the configuration information.

Preferably, the configuration information memory unit comprises M memory blocks, each of which stores the address of configuration information in the external memory, content of configuration information, and priority of configuration information.

Preferably, the method further comprises step (4): repeating step (1) to step (3), till all the configuration information is sent and the functional reconfiguration is accomplished.

Benefits

In the present invention, with the configuration information cache management system based on pre-decoding analysis applicable to a reconfigurable system that is oriented to media processing, the times of accessing to the external memory during configuration information reading can be reduced, and thereby the configuration information transmission time can be reduced. In addition, the present invention provides a corresponding configuration information cache management method, which applies a priority-based replacement strategy and employs a three-level streamline model, and changes the configuration cache management model in conventional coarse-grained reconfigurable systems; thus, the efficiency of dynamic reconfiguration in large-size coarse-grained reconfigurable systems is improved.

DETAILED DESCRIPTION OF THE PREFERRED EMBODIMENTS

Hereunder the present invention will be further detailed in embodiments, with reference to the accompanying drawings. It should be appreciated that these embodiments are provided only for describing the present invention, and shall not be deemed as constituting any limitation to the scope of the present invention. Those skilled in the art can make various equivalent modifications to the present invention without departing from the spirit of the present invention, but all these modifications shall be deemed as falling into the protected scope as confined by the attached claims.

Figures 1, 2:
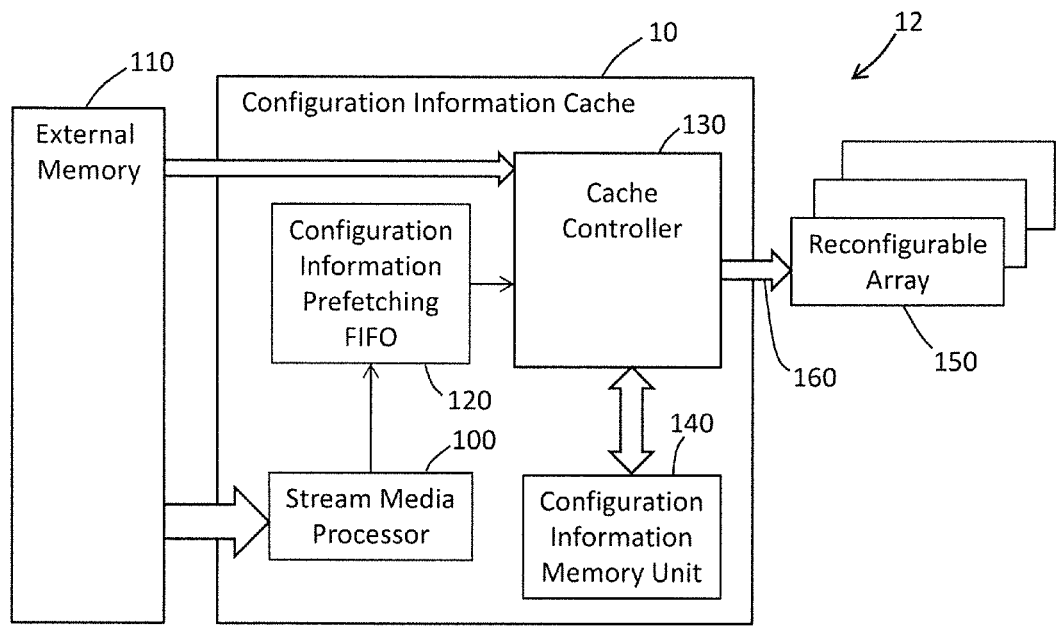
FIG. 1 is a schematic structural diagram of the configuration information cache based on pre-decoding analysis applicable to a reconfigurable system that is oriented to media processing according to the embodiments of the present invention.
FIG. 2 is a schematic diagram of the storage format of configuration information index in the configuration information prefetching FIFO module in the configuration information cache based on pre-decoding analysis applicable to a reconfigurable system that is oriented to media processing in FIG. 1.

As shown in FIG. 1, a configuration information cache 10 based on pre-decoding analysis 12 applicable to a reconfigurable system that is oriented to media processing comprises: a stream media processor module 100, configured to parse the macro blocks in a code stream obtained from the external memory 110 and generate a configuration information index corresponding to the subtask required for processing the macro blocks; a configuration information prefetching FIFO module 120, configured to sequentially store the configuration information indexes generated by the stream media processor module 100; a configuration information memory unit 130, configured to cache the configuration information obtained from the external memory 110; a cache controller module 130, configured to search for and replace the configuration information in the configuration information memory unit 140, and send the required configuration information to one of eight reconfigurable arrays 150.

Figures 3, 4:
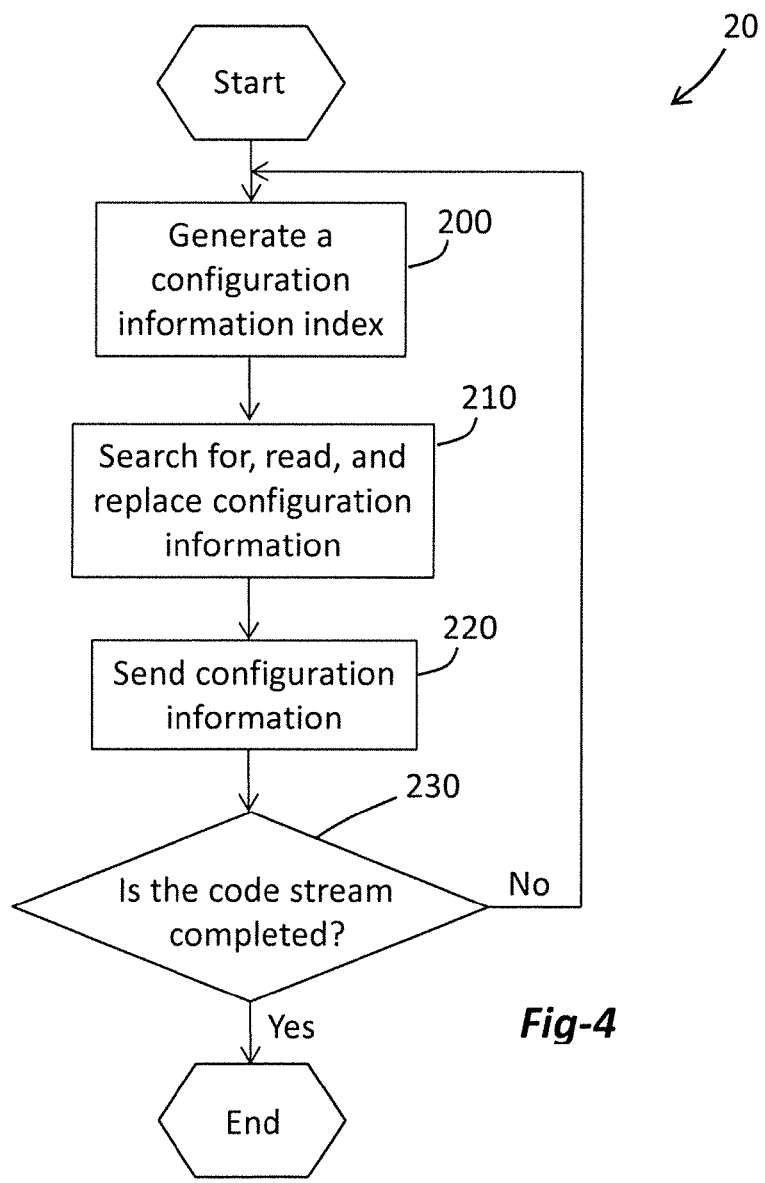
FIG. 3 is a schematic diagram of the storage format of configuration information in the configuration information memory unit in the configuration information cache based on pre-decoding analysis applicable to a reconfigurable system that is oriented to media processing in FIG. 1.
FIG. 4 is a flow chart of the configuration information cache management method based on pre-decoding analysis applicable to a reconfigurable system that is oriented to media processing in an embodiment according to the present invention.

As shown in FIG. 2 and FIG. 3, the configuration information prefetching FIFO module comprises N FIFO units, each of which stores a configuration information index that consists of configuration information address and target reconfigurable array ID. The configuration information memory unit comprises M memory blocks, each of which consists of configuration information address, configuration information content, and configuration information priority. Wherein, the configuration information priority is the number of occurrence times of the address of a set of configuration information in the configuration information prefetching FIFO module at the current moment, i.e., the number of times that the configuration information will be used in an up-coming period. The values of N and M can be set as required according to the number of reconfigurable arrays, total number of configuration information sets, and size of each set of configuration information, but different values will have different influences on the configuration information transmission efficiency.

As shown in FIG. 4, the configuration information cache management method 20 comprises: generating a configuration information index 200: by parsing macro blocks in advance, the stream media processor 100 generates a configuration information index corresponding to the subtask required for processing the macro blocks, wherein, the configuration information index consists of the address of configuration information in the external memory 110 and the ID of the reconfigurable array that uses the configuration information, and the stream media processor stores the configuration information index in the configuration information prefetching FIFO module 120; searching for, reading, and replacing configuration information 210: the cache controller 130 fetches a configuration information index from the configuration information prefetching FIFO module 120, and searches for the required configuration information in the configuration information memory unit 140 according to the configuration information address; if the required configuration information exists in the configuration information memory unit 140, the cache controller 130 will directly read the configuration information; if the configuration information does not exist in the configuration information memory unit 140, the cache controller 130 will fetch the required configuration information from the external memory 110, and then cache the required configuration information in the configuration information memory unit 140, and replace a set of configuration information with the lowest priority in the configuration information memory unit 140; sending configuration information 220: the cache controller 130 sequentially sends the configuration information read by it to the corresponding reconfigurable arrays 150, and thereby accomplishes functional reconfiguration.

The three stages are executed in a streamline pattern. Therefore, the resource of configuration information cache is utilized fully, and the efficiency of dynamic reconfiguration in large-size coarse-grained reconfigurable systems can be improved.

Figure 5:
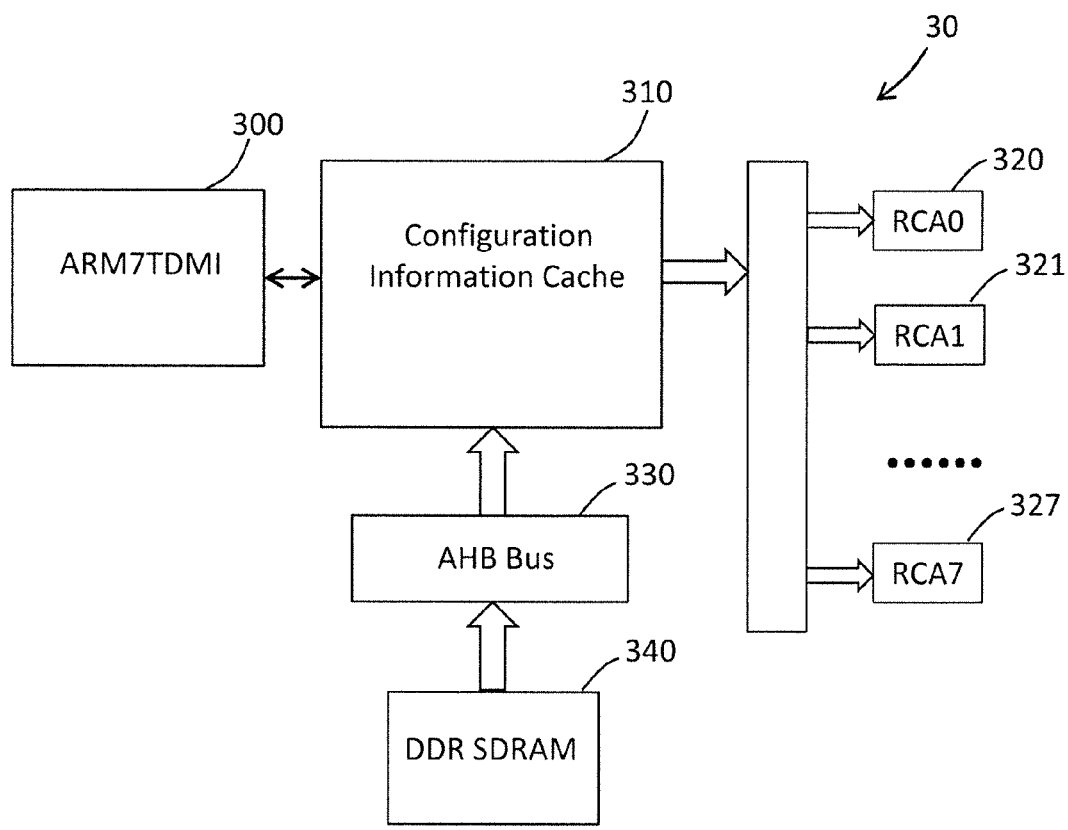
FIG. 5 shows the application connections of the configuration information cache based on pre-decoding analysis applicable to a reconfigurable system that is oriented to media processing in an the embodiment according to the present invention.

As shown in FIG. 5, the configuration information cache structure 30 and management method based on pre-decoding analysis applicable to a reconfigurable system that is oriented to media processing according to the present invention are used for high definition digital video decoding in H.264 protocol (H.264 1080p@30 fps HiP@Level 4), to meet the requirement for high definition video decoding of H.264 1080p@30 fps HiP@Level 4. The system structure 30 comprises: an ARM7TDMI processor 300 that serves as a master controller, a configuration information cache 310, reconfigurable arrays (RCAs) 320, 321, . . . 327, an AHB bus 330, and DDR SDRAM 340. The ARM7TDMI processor 300 having advantages of compact size, high performance, low power consumption, and good compiler support, etc. is selected as the CPU of master controller to control the scheduling during system operation; the configuration information cache 310 is connected with the external memory via a 32 bit AHB bus 330, and commonly used embedded DDR SDRAM external memory 340 is used as the external memory, which supports 64-bit data width, has high performance price ratio and low specific energy consumption; eight RCAs 320-327 are deployed, and each RCA contains 8×8 PEs. For the verification system, the address width of each set of configuration information is 14 bits, and the size of each set of configuration information is 1 KBytes. The configuration information prefetching FIFO module 120 contains 128 FIFO units (i.e., N=128), and, in each FIFO unit, the width of target reconfigurable array ID is 3 bits, the value range of the ID is 0 to 7, and the reconfigurable arrays 150 are identified as RCA0 to RCA7 (320-327) sequentially. The configuration information memory unit 140 contains 32 memory blocks (i.e., M=32), and, in each memory block, the width of configuration information priority is 7 bits. The bit width of the configuration information transmission interface 160 between the configuration information cache 10 and RCAs 150 is 512 bits.

For comparison purpose, a comparative verification system is deployed. Compared with the above-mentioned verification system, the difference is that the configuration information prefetching FIFO module 120 is removed form the configuration information cache 10, and the replacement strategy for the configuration information memory unit 140 is a LRU (Least Recently Used) strategy that is commonly used in the conventional design. The configuration information memory unit 140 is in the same size and structure as that described above. The experimental result indicates: with the configuration information cache structure 10 and management method 20 based on pre-decoding analysis 12 applicable to a reconfigurable system that is oriented to media processing according to the present invention, the average hit rate of the configuration information cache is higher than that in the comparative verification system by 4.5%, and the clock cycles required for transmission of configuration information are reduced by 50% or more.

Wherein, ReConfigurable Arrays are abbreviated as RCAs; Processing Elements are abbreviated as PEs.

It is appreciated that the embodiments and examples described above are for illustrative purposes only and that changes will occur to those skilled in the art and yet remain within the scope of the invention. As such, it is the claims and all equivalents thereof that define the scope of the invention.

The invention claimed is:

1. A configuration information cache management system based on pre-decoding analysis, comprising a stream media processor module, a configuration information prefetching FIFO module, a configuration information memory unit, and a cache controller module;
the stream media processor module is configured to parse the macro blocks in the code stream obtained from the external memory, generate a configuration information index corresponding to the subtask required for processing the macro blocks, and output the configuration information index to the configuration information prefetching FIFO module; the configuration information index comprises the address of configuration information in the external memory and the ID of the reconfigurable array that uses the configuration information;

the configuration information prefetching FIFO module is configured to sequentially store the configuration information indexes generated by the stream media processor module, and provide a basis for replacement of the configuration information in the configuration information memory unit;

the configuration information memory unit is configured to cache the configuration information fetched from the external memory;

the cache controller module is configured to fetch a configuration information index from the configuration information prefetching FIFO module, and judge whether the required configuration information exists in the configuration information memory unit according to the address of the configuration information in the external memory; if the required configuration information exists in the configuration information memory unit, the cache controller module will directly read the configuration information; if the required configuration information does not exist in the configuration information memory unit, the cache controller module will fetch the required configuration information from the external memory, and then cache the required configuration information in the configuration information memory unit, and finally send the required configuration information to the corresponding reconfigurable array.

2. The configuration information cache management system based on pre-decoding analysis according to claim 1, wherein, the configuration information prefetching FIFO module comprises N FIFO units, each of which stores the address of configuration information in the external memory and the ID of the reconfigurable array that uses the configuration information.

3. The configuration information cache management system based on pre-decoding analysis according to claim 1, wherein, the configuration information memory unit comprises M memory blocks, each of which stores the address of configuration information in the external memory, content of configuration information, and priority of configuration information.

4. A management method that utilizes the configuration information cache management system based on pre-decoding analysis as set forth in claim 1, comprising the following steps:

(1) generating a configuration information index: by parsing the macro blocks in a code stream obtained from the external memory in advance, the stream media processor generates a configuration information index corresponding to the subtask required for processing the macro blocks, and outputs the configuration information index to the configuration information prefetching FIFO module; the configuration information index comprises the address of configuration information in the external memory and the ID of the reconfigurable array that uses the configuration information;

(2) searching for, reading, and replacing configuration information: the cache controller module fetches a configuration information index from the configuration information prefetching FIFO module, and searches for the required configuration information in the configuration information memory unit according to the address of the configuration information in the external memory; if the required configuration information exists in the configuration information memory unit, the cache controller module will directly read the required configuration information; if the required configuration information does not exist in the configuration information memory unit, the cache controller module will fetch the required configuration information from the external memory, and then cache the required configuration information in the configuration information memory unit, and replace the configuration information in the configuration information memory unit;

(3) sending configuration information: the cache controller module sequentially sends the configuration information read by it to the corresponding reconfigurable arrays.

5. The management method that utilizes the configuration information cache management system based on pre-decoding analysis as set forth in claim 4, wherein, the procedure of replacing the configuration information in the configuration information memory unit comprises: replacing a set of configuration information that has the lowest priority in the configuration information memory unit with the required configuration information.

6. The management method that utilizes the configuration information cache management system based on pre-decoding analysis as set forth in claim 5, wherein, the configuration information priority is the number of occurrence times of the address of configuration information in the external memory in the configuration information prefetching FIFO module at the current moment.

7. The management method that utilizes the configuration information cache management system based on pre-decoding analysis as set forth in claim 5, wherein, the priority is updated before the configuration information is replaced.

8. The management method that utilizes the configuration information cache management system based on pre-decoding analysis as set forth in claim 4, wherein, the configuration information prefetching FIFO module comprises N FIFO units, each of which stores the address of configuration information in the external memory and the ID of the reconfigurable array that uses the configuration information.

9. The management method that utilizes the configuration information cache management system based on pre-decoding analysis as set forth in claim 4, wherein, the configuration information memory unit comprises M memory blocks, each of which stores the address of configuration information in the external memory, content of configuration information, and priority of configuration information.

10. The management method that utilizes the configuration information cache management system based on pre-decoding analysis as set forth in claim 4, further comprising step (4): repeating step (1) to step (3), till all configuration information is sent.

* * * * *